(12) United States Patent
Tam et al.

(10) Patent No.: US 6,900,668 B1
(45) Date of Patent: May 31, 2005

(54) HIGH SPEED SINGLE ENDED SENSE AMPLIFIER WITH BUILT-IN MULTIPLEXER

(75) Inventors: Kenway W. Tam, Cupertino, CA (US); Shree Kant, Union City, CA (US)

(73) Assignee: Sun Microsystems Inc., Santa Clara, CA (US)

( * ) Notice: Subject to any disclaimer, the term of this patent is extended or adjusted under 35 U.S.C. 154(b) by 0 days.

(21) Appl. No.: 10/730,356

(22) Filed: Nov. 24, 2003

(51) Int. Cl.[7] .............................................. G01R 19/00
(52) U.S. Cl. ........................ 327/51; 327/199; 365/203
(58) Field of Search ............................. 327/50, 51, 54, 327/55, 198, 199, 200, 208, 210; 365/203, 205

(56) References Cited

U.S. PATENT DOCUMENTS 6,507,222 B1 * 1/2003 Jensen et al. .................. 327/51
6,535,041 B1 * 3/2003 Bucki et al. ................. 327/199

* cited by examiner

*Primary Examiner*—Long Nguyen
(74) *Attorney, Agent, or Firm*—Martine Penilla & Gencarella LLP

(57) ABSTRACT

A first sense amp circuit includes a pre-charge circuit, a keeper circuit, a select device and a driver device. The pre-charge circuit coupled to an input data line, the input data line being coupled to an input of a first inverter. The keeper circuit coupled in parallel with the first inverter. The select device coupled to a discharge path of the first inverter. The driver device coupled in parallel to an output data line of the first inverter.

17 Claims, 4 Drawing Sheets

HIGH SPEED SINGLE ENDED SENSE AMPLIFIER WITH BUILT-IN MULTIPLEXER

BACKGROUND OF THE INVENTION

1. Field of the Invention

The present invention relates generally to sense amplifiers, and more particularly, to methods and systems for a high-speed sense amplifier.

2. Description of the Related Art

A sense amplifier is often used to detect and couple (and even amplify) a data signal level on a data line. Sense amplifiers are typically used between a data output and a data input. By way of example, a sense amplifier can be used to detect a data signal level on a data line or data bus and then output the detected data level to an input of a processor.

FIG. 1 is a typical sense amplifier circuit 100. A data signal input line 112 conducts a data signal, such as from a data line or bus, to the input of a skewed inverter 106. The skewed inverter 106 senses a data signal on the data signal input line 112. When the data signal level passes a threshold level, the skewed inverter 106 switches state. A keeper circuit 108 latches the skewed inverter 106 once the sense amplifier has switched. An inverter 102 and NMOS 104 form a pre-charge circuit to pull up the data signal line 112 to reduce the time required for the data signal to raise to the threshold level. As a result, the switching time for the skewed inverter 106 is substantially reduced. An inverter 110 forms an output buffer for the skewed inverter 106. The inverter 10 can also amplify the output signal.

Output of the inverter 110 switches state approximately two "gate delays" after the data signal on the data signal line 112 raises to the threshold level required to cause the skewed inverter 106 to switch. The two gate delays are the cumulative time required for the skewed inverter 106 and the inverter 110 to switch.

In many applications and uses a sense amp needs to have less than the two-gate delay so as to not unduly delay the output data signal. In view of the foregoing, there is a need for a sense amp having a delay of less than a two-gate delay.

SUMMARY OF THE INVENTION

Broadly speaking, the present invention fills these needs by providing a sense amp circuit having less than a two-gate delay. It should be appreciated that the present invention can be implemented in numerous ways, including as a process, an apparatus, a system, computer readable media, or a device. Several inventive embodiments of the present invention are described below.

One embodiment includes a first sense amp circuit that includes a pre-charge circuit, a keeper circuit, a select device and a driver device. The pre-charge circuit coupled to an input data line, the input data line being coupled to an input of a first inverter. The keeper circuit coupled in parallel with the first inverter. The select device coupled to a discharge path of the first inverter. The driver device coupled in parallel to an output data line of the first inverter.

A half latch circuit can also be coupled to the input data line. The half latch circuit can include a first input and a second input, the first input coupled to an inverse of a pre-charge control signal, the second input coupled to the output of the first inverter.

The select device can include a select control signal coupled to a control input of the select device. The select device can control the discharging of the first inverter.

The driver device can include a NAND gate and a second inverter. The NAND gate having a first input coupled to a select control signal and a second input coupled to an output of the second inverter. The second inverter having an input coupled to the output of the first inverter. The output of the NAND gate being coupled to the output of the first inverter.

The driver device is not in series with a data signal path through the first inverter. The circuit can also include a second NAND gate having a first input coupled to an output of the first inverter, a second sense amp circuit having an output coupled to a first input of the second NAND gate. A total delay through each of the first sense amp circuit and the second sense amp circuit and the second NAND is substantially equal to a two-gate delay. The first inverter can include a skewed inverter.

Another embodiment includes a method of detecting a data signal level. The method includes pre-charging an input data line of a first inverter, receiving a data signal on the input data line sufficient to cause the first inverter to switch, outputting an output data signal level in less than a two-gate delay, disabling the pre-charging the input data line of the first inverter, and resetting the output data signal level when a control signal is received.

Resetting the output data signal level includes applying a predetermined voltage level to the input data line of the first inverter. Resetting the output data signal level can also include applying a predetermined voltage level to an output of the first inverter when the select signal is received. Resetting the output data signal level can also include discharging the first inverter when the select signal is received.

The output data signal can also be driven. Driving the output data signal can include applying a predetermined voltage level to an output of the first inverter.

The method can also include coupling an output of the first inverter to a first input of a second NAND gate and coupling an output of the second inverter to a second input of the second NAND gate. A total delay through each of the first sense amp circuit and the second sense amp circuit and the second NAND is substantially equal to a two-gate delay. The first inverter can include a skewed inverter.

Yet another embodiment provides a circuit that includes a first sense amp circuit and a second sense amp circuit, each having a delay substantially equal to a one-gate delay. The circuit also includes a multiplexer device having a first input coupled to an output of the first sense amp circuit and a second input coupled to an output of the second sense amp circuit. A selection device coupled to a selection control of each of the first sense amp circuit and the second sense amp circuit can also be included.

The improved sense amplifier circuits described herein provide an improved (faster) switching speed. The faster switching speed allows the improved sense amplifier to be used in applications requiring higher switching speeds.

The faster switching speed also allows the improved sense amplifier to be used in combinations such as multiplexing two or more sense amplifiers and still have substantially the same data throughput delay as a single prior art sense amp circuit.

The improved sense amplifier circuits also substantially reduce the conditional periods in the various data signals.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Several exemplary embodiments for a faster switching sense amp circuit will now be described. It will be apparent to those skilled in the art that the present invention may be practiced without some or all of the specific details set forth herein.

A faster switching sense amp circuit allows the required data signal to e more rapidly transmitted through the sense amp circuit and therefore overall faster data transmission can be accomplished. One embodiment includes a select device that allows the sense amp circuit to be selected. The select device is not in the data path through the sense amp circuit and therefore does not add any gate delays to the to data path and therefore does not affect the timing. An output driver in series with the output of the sense amp circuit is no longer used. A NAND gate is used to pull down the output of the sense amp circuit and effectively drive the output of the sense amp circuit. As a result the delay caused by the prior art output driver in series with the output of the sense amp circuit is substantially eliminated.

Figure 1:
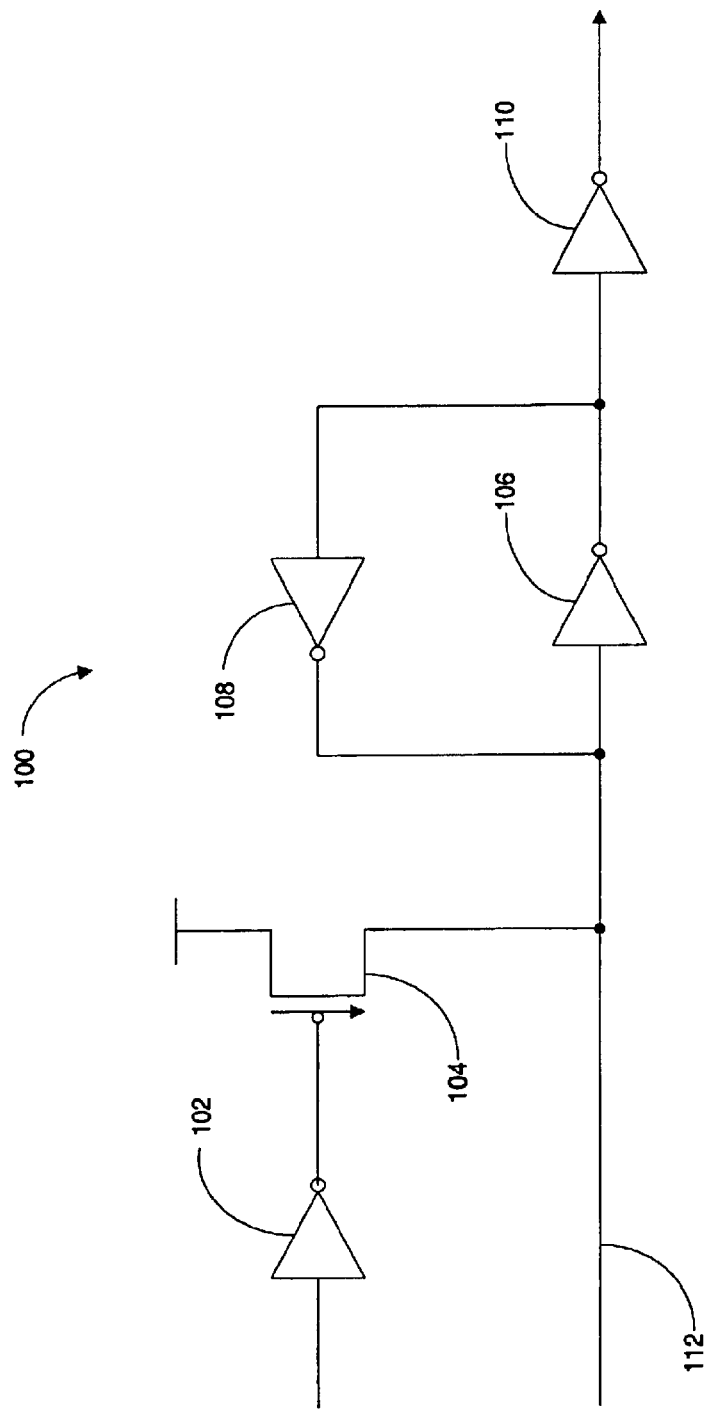
FIG. 1 is a typical sense amplifier circuit.
Figure 2:
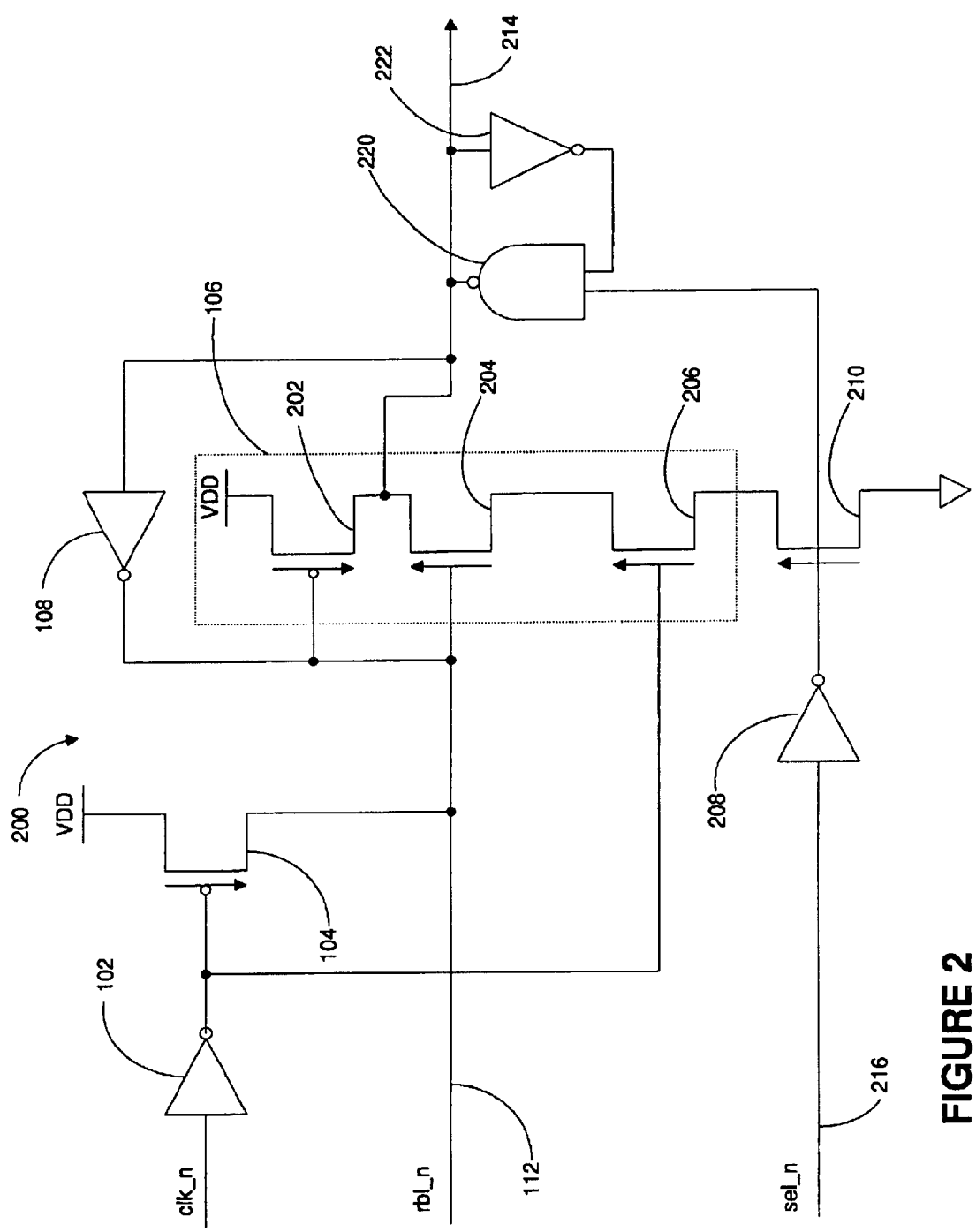
FIG. 2 is a sense amp circuit in accordance with one embodiment of the present invention.

FIG. 2 is a sense amp circuit 200 in accordance with one embodiment of the present invention. Several of the components are the same as were described in the prior art sense amp circuit 100 described in FIG. 1 above. By way of example, the NMOS 202 and PMOS 204 and 206 perform the same function as the skewed inverter 106 of FIG. 1. Only the skewed inverter 106 (i.e. the NMOS 202 and PMOS 204) are in the data line path between input 112 and output 214. As a result the data signal delay of the sense amp circuit 200 is substantially less than the two-gate delay of the prior art sense amp circuit 100.

An inverter 208 and PMOS 210 are used to provide a select control signal sel_n to enable/disable the reset (i.e., discharging) of the skewed inverter 106. A low select control signal sel_n is applied to the select line 216 and input of the inverter 208. The output of the inverter 208 switches high and is applied to the gate of the PMOS 210. When the PMOS 210 is enabled, the skewed inverter 106 can discharge when the PMOS 206 is also enabled. The PMOS 206 is enabled when a low clk_n signal is applied to the inverter 102. The output of the inverter 102 then switches high. The high output of the inverter 102 is applied to the NMOS 104 and the PMOS 206. The PMOS 206 is enabled and allows the skewed inverter 106 to discharge through the PMOS 210 to ground. When a high clk_n signal is applied to the inverter 102. The output of the inverter 102 then switches low, enabling NMOS 104 to apply VDD to pull up the data input line 112.

The NAND gate 220 has a first input coupled to the output of the inverter 208 and a second input coupled to the output of the inverter 222. The output of the NAND gate 220 is coupled to the output data line 214. The input of the inverter 222 is also coupled to the output data line 214. When the select signal enabled the PMOS 210 to discharge the skewed inverter 106, the NAND gate 220 applies a low to the output line 214 further aiding in discharging the skewed inverter line 106. When the NAND gate 220 applies a low to the output of the skewed inverter 106, the output of sense amp circuit 200 can switch to a low in less time. This further reduces the total delay required by the of sense amp circuit 200.

Figure 3:
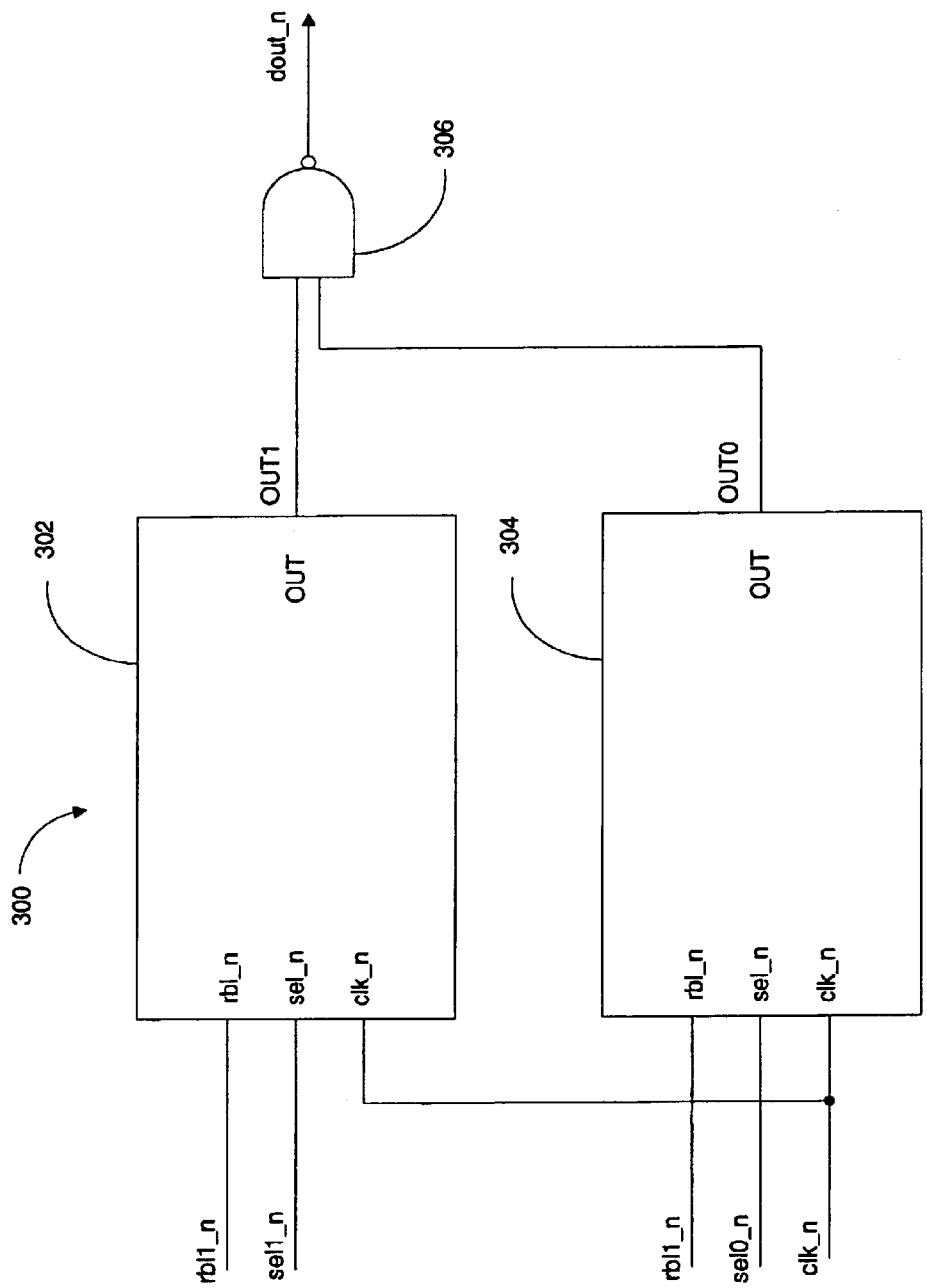
FIG. 3 is a block diagram of a pair of multiplexed sense amp circuits, in accordance with one embodiment of the present invention.

Because the signal throughput delay of the sense amp circuit 200 is substantially less than the two-gate delay of the prior art sense amp circuit 100, then the sense amp circuit 200 can be used in a variety of applications that were previously not possible. FIG. 3 is a block diagram of a pair of multiplexed sense amp circuits 302, 304, in accordance with one embodiment of the present invention. Each of the sense amp circuits 302, 304 is substantially equivalent to the sense amp circuit 200 shown in FIG. 2 above. The sense amp circuits 302 and 304 are in series with a NAND gate 306. The approximately one-gate delay of each of the sense amp circuits 302 and 304 are in series with the one-gate delay of the NAND gate 306. As a result the overall delay of the multiplexed pair of sense amp circuits 302 and 304 is approximately a two-gate delay which is substantially similar to the two-gate delay of the prior art sense amp circuit 100, as discussed above.

The pair of sense amp circuits 302 and 304 are multiplexed by being enabled in turn via the respective sel_n signal inputs as described above. By way of example the multiplexed pair of sense amp circuits 302 and 304 can be used in an even-odd bit selection system. This even-odd bit selection system effectively multiplexes the two even-odd bit inputs rbl1_0 and rbl0_0 into a single output data signal dout_n.

Figure 4:
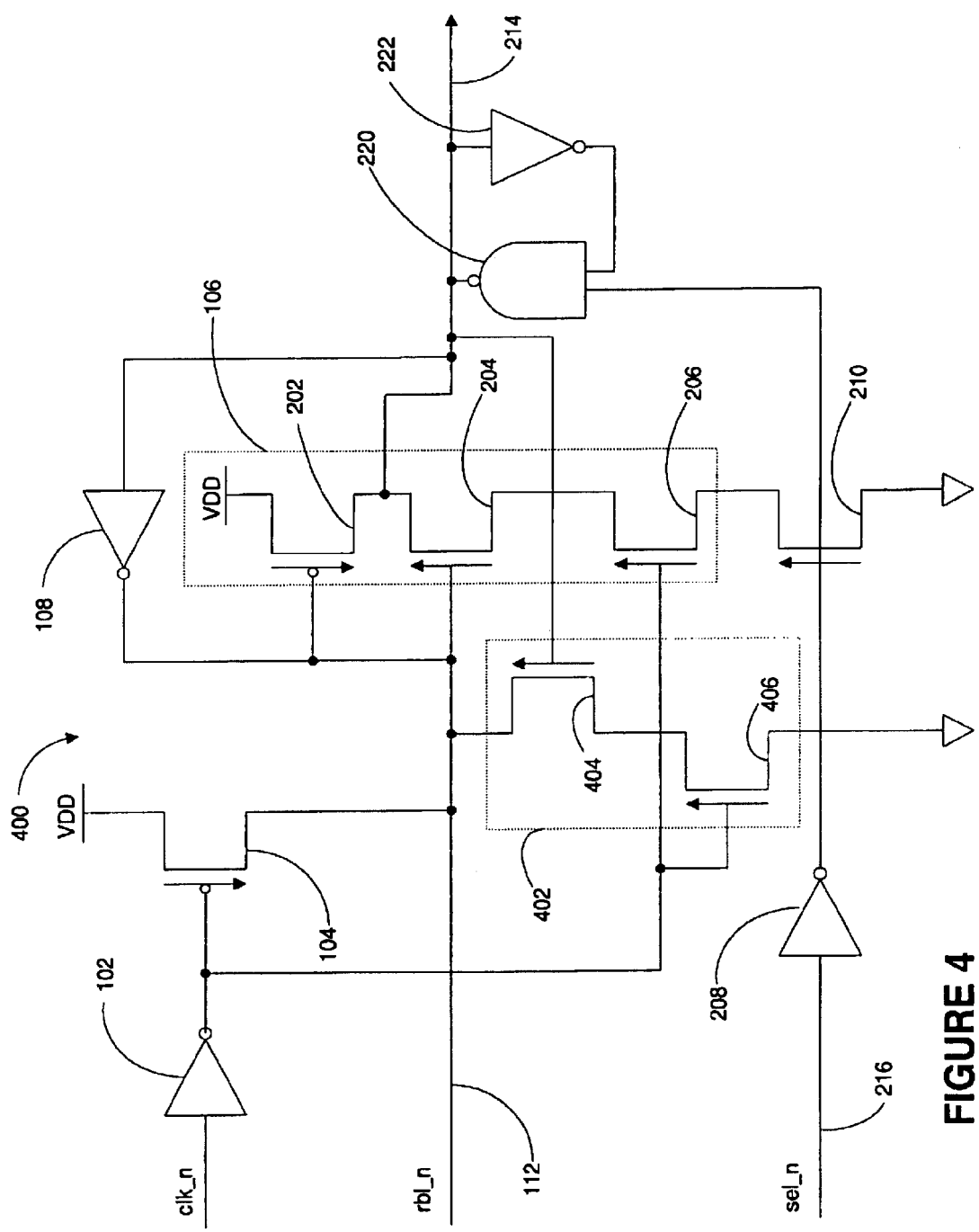
FIG. 4 is a sense amp circuit in accordance with one embodiment of the resent invention.

FIG. 4 is a sense amp circuit 400 in accordance with one embodiment of the resent invention. The sense amp circuit 400 is substantially similar to the sense amp circuit 200 described above. One addition is a half latch circuit 402. The half latch circuit 402 includes PMOS 404 and 406. PMOS 404 has a gate coupled to the output 214 of the sense amp circuit 400. Whenever the output of the sense amp circuit 400 is high, the PMOS 404 can conduct. PMOS 406 has a gate coupled to the pre-charge signal such that when the pre charge NMOS 104 is not pre-charging the input data line 112, the half latch circuit 402 applies a low to the input data line 112. Applying a low to the input data line 112 ensures that the input data line 112 does not float around at a low condition but rather is in effect latched to a low data signal level.

The pre-charge NMOS 104 and the half latch circuit 402 act to substantially reduce any "conditional states" that may occur on the input 112 of the sense amp circuit 400. The NAND gate 220 and the inverter 222 act to substantially reduce any "conditional states" that may occur on the output 214 of the sense amp circuits 200 and 400.

While the above described embodiments have been described in terms of PMOS and NMOS devices, such that the sense amplifier switches as the input signal passes upward through a high threshold voltage, it should be understood that the various embodiments of the improved sense amp circuits could also be enabled using a sense amplifier that switches as the input signal passes downward through a low threshold voltage.

With the above embodiments in mind, it should be understood that the invention may employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A first sense amp circuit comprising:
   a pre-charge circuit coupled to an input data line, the input data line being coupled to an input of a first inverter;
   a keeper circuit coupled in parallel with the first inverter;
   a select device coupled in series with a discharge path of the first inverter; and
   a driver device coupled to latch an output data line of the first inverter.

2. The circuit of claim 1, further comprising a half latch circuit coupled to the input data line.

3. The circuit of claim 2, wherein the half latch circuit includes a first input and a second input, the first input coupled to an inverse of a pre-charge control signal, the second input coupled to the output data line of the first inverter.

4. The circuit of claim 1, wherein the select device includes a select control signal coupled to a control input of the select device.

5. The circuit of claim 1, wherein the select device controls the discharging of the first inverter.

6. The circuit of claim 1, wherein the driver device includes a first NAND gate and a second inverter, the first NAND gate having a first input coupled to a select control signal and a second input coupled to an output of the second inverter, the second inverter having an input coupled to the output of the first inverter, the output of the first NAND gate being coupled to the output of the first inverter.

7. The circuit of claim 1, wherein the driver device having an output directly connected to the output data line of the first inverter.

8. The circuit of claim 1, wherein the output data line of the first inverter is coupled to a first input of a second NAND gate; and a second input of the second NAND gate is coupled to a second amp circuit.

9. The circuit of claim 8, wherein a total delay through each of the first sense amp circuit and the second sense amp circuit and the second NAND is substantially equal to a two-gate delay.

10. The sense amp circuit of claim 1, wherein the first inverter includes a skewed inverter.

11. A method of detecting a data signal level comprising:
    pre-charging an input data line of a first inverter;
    receiving the data signal level on the input data line sufficient to cause the first inverter to switch;
    outputting an output data signal level in less than a two-gate delay;
    disabling the pre-charging of the input data line of the first inverter; coupling a select device in series with a discharge path of the first inverter; and
    resetting the output data signal level when a select signal is received in a first state.

12. The method of claim 11, wherein resetting the output data signal level includes applying a predetermined voltage level to an output data line of the first inverter.

13. The method of claim 11, wherein resetting the output data signal level includes applying a predetermined voltage level to an output data line of the first inverter when the select signal is received in the first state.

14. The method of claim 11, wherein resetting the output data signal level includes discharging the first inverter when the select signal is received in the first state.

15. The method of claim 11, further comprising driving the output data signal level.

16. The method of claim 15, wherein driving the output data signal level includes applying a predetermined voltage level to an output data line of the first inverter.

17. The method of claim 11, wherein the first inverter includes a skewed inverter.

* * * * *